United States Patent [19]

Hansen

[11] Patent Number: 4,885,801

[45] Date of Patent: Dec. 5, 1989

[54] METHOD AND CIRCUIT FOR CONVERTING FREQUENCY-MODULATED SIGNALS THROUGH AT LEAST ONE INTERMEDIATE FREQUENCY INTO LOW FREQUENCY SIGNALS

[75] Inventor: Jens Hansen, Berlin, Fed. Rep. of Germany

[73] Assignee: H.U.C. Elektronik Hansen & Co., Fed. Rep. of Germany

[21] Appl. No.: 116,567

[22] PCT Filed: Feb. 23, 1987

[86] PCT No.: PCT/DE87/00068
§ 371 Date: Sep. 23, 1987
§ 102(e) Date: Sep. 23, 1987

[87] PCT Pub. No.: WO87/05170
PCT Pub. Date: Aug. 27, 1987

[30] Foreign Application Priority Data

Feb. 24, 1986 [DE] Fed. Rep. of Germany ....... 3606250

[51] Int. Cl.⁴ .............................................. H04B 1/10
[52] U.S. Cl. .................................... 455/264; 455/258; 455/307
[58] Field of Search ............... 455/164, 165, 182, 183, 455/192, 196, 197, 205, 208, 255, 256, 257, 258, 264, 307, 312, 318, 313, 340

[56] References Cited

U.S. PATENT DOCUMENTS

| | | | |
|---|---|---|---|
| 3,150,323 | 9/1964 | Stavis et al. | 455/337 |
| 3,626,301 | 12/1971 | Develet, Jr. | 455/264 |
| 3,922,609 | 11/1975 | Grohmann | 455/192 |
| 3,936,753 | 2/1976 | Clark | 455/192 |
| 4,263,675 | 4/1981 | Hongu et al. | 455/192 |
| 4,293,818 | 10/1981 | Jarger | 455/208 |
| 4,569,085 | 2/1986 | Nolde et al. | 455/192 |
| 4,653,117 | 3/1987 | Heck | 455/264 |
| 4,658,438 | 4/1987 | Kamata et al. | 455/192 |

FOREIGN PATENT DOCUMENTS 3048263 12/1980 Fed. Rep. of Germany .
56-114453 2/1980 Japan .

Primary Examiner—Robert L. Griffin
Assistant Examiner—Curtis Kuntz
Attorney, Agent, or Firm—Basile and Hanlon

[57] ABSTRACT

A mixer mixes received frequency modulated signals with a frequency provided by a voltage controlled oscillator to generate intermediate frequency signals. The intermediate frequency signals are filtered by a filter and input to a demodulator to generate low frequency signals. A control voltage is derived from the demodulator to control the resonant frequency of the filter in response to the frequency shift of the intermediate frequency signals. A phase rotator is coupled between the demodulator and the oscillator to phase rotate the control voltage of the oscillator. In a preferred embodiment, the phase rotator is an inverter.

5 Claims, 1 Drawing Sheet

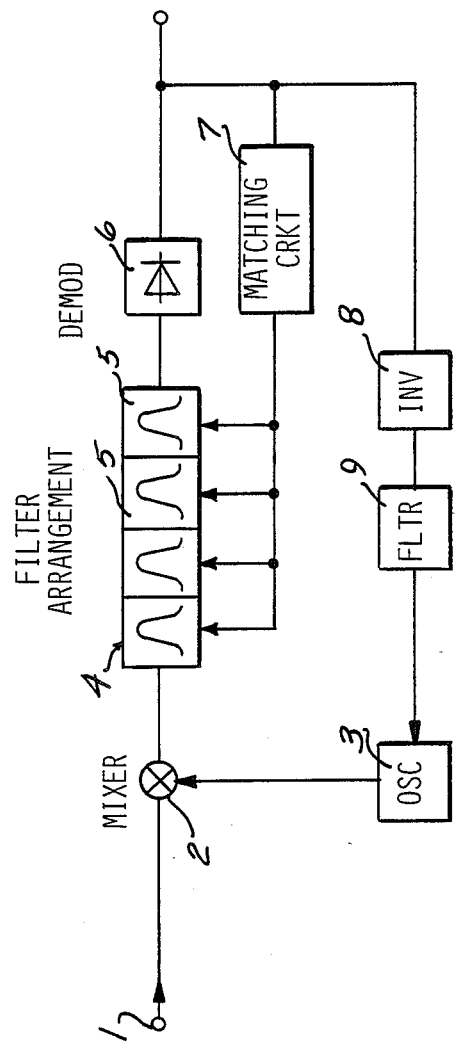

METHOD AND CIRCUIT FOR CONVERTING FREQUENCY-MODULATED SIGNALS THROUGH AT LEAST ONE INTERMEDIATE FREQUENCY INTO LOW FREQUENCY SIGNALS

BACKGROUND OF THE INVENTION

1. Field of the Invention

The invention relates to a method and to a circuit arrangement for converting frequency modulated signals through at least one intermediate frequency into low frequency signals.

2. Description of the Prior Art

West German DE-OS No. 30 48 263 describes a radio receiver provided with a filter arrangement. The received signal is converted via one or more mixer stages into intermediate frequency signals, which are fed via intermediate frequency filters to a demodulator, in which they are converted into low frequency signals. In order to keep interference at a minimum level, the filters are constructed in a narrow-band manner. A control voltage, derived from the output voltage of the demodulator displaces the resonance frequency of the narrow-band intermediate frequency filter connected upstream of the demodulator in such a way that the particular instantaneous value of the intermediate frequency is always within the band pass range of the filter.

As the control voltage is generated after mixing and selection as a result of the reverse control, control delays occur which are essentially given by the envelope delays of the filter. This means that the control voltage for the filter and the intermediate frequency voltage are time-shifted and there is a relative movement between the filter frequency and the intermediate frequency. In the case of high frequencies, this delay leads to difficulties in the follow-up of the filter so that interference can occur.

The intent of this invention is to provide a method and a circuit arrangement for converting frequency modulated signals through at least one intermediate frequency into low frequency signals, while improving the follow-up characteristics of the filter.

SUMMARY OF THE INVENTION

According to this invention this problem is solved by driving the oscillator is such a way that in the high range of low frequencies a deflection reduction is brought about, such that the resonance frequency of the filters is only moved backwards and forwards to a limited extent in the high frequencies to improve the follow-up characteristics of the filters. The deflection reduction preferably takes place through a phase rotation of the low frequency signals used for driving the oscillator, said phase rotation being performed in simple manner by an inverter connected in the feedback path.

BRIEF DESCRIPTION OF THE DRAWING

An embodiment of the invention is shown in the drawing and is described in greater detail hereinafter. The single drawing shows the circuitry according to the invention.

DESCRIPTION OF THE PREFERRED EMBODIMENT

The drawing reference numeral 1 is the input terminal of the circuit arrangement, to which are applied the frequency modulated reception signals or the intermediate frequency output signals of an intermediate frequency stage. Reference numeral 2 designates a mixer stage connected to a voltage-controlled oscillator 3 and connected to a filter arrangement 4 comprising several filters 5. Filter arrangement 4 is connected to the input of a demodulator 6 at whose output appear the low frequency signals. A first feedback circuit is provided across a matching circuit 7 between the output of demodulator 6 and filter arrangement 4 and a second feedback circuit is provided between the output of the demodulator 6 and the oscillator 3. An inverter 8 and a low-pass filter 9 are connected in the second return or feedback circuit.

The modulated, high frequency reception signals or the intermediate frequency signals pass to the mixer stage 2, where they are mixed with the output signal of the oscillator 3 to generate intermediate frequency signals at the output of the mixer stage. In accordance with its pass band, the filter arrangement 4 filters out the intermediate frequency signals, which are demodulated to low frequency signals in the demodulator 6. The low frequency output voltage of the demodulator 6 is supplied to the filter arrangement 4 across matching circuit 7 in such a way that the center frequency of each filter 5 follows the instantaneous frequency of the intermediate frequency signal which can be taken from the mixer 2. As a result of the delay, limits are placed on the follow-up of the center frequency at high frequencies. An improvement in the follow-up characteristics can be obtained if the deflection, i.e. the displacement of the intermediate frequency signal and therefore the displacement of the low frequency signal, is reduced in the higher frequency range. A deflection reduction can be brought about in that the voltage-controlled oscillator 3 supplies a voltage which is increasingly in phase with the intermediate frequency towards the high range of low frequencies. this means that the low frequency signals fed back to the oscillator 3 must be phase-rotated in such a way that at high frequencies of the low frequency range the oscillator voltage is in phase with the intermediate frequency voltage.

As in the mixer 2 a voltage of the difference frequency of its two input signals is formed with an increase in phase effect. The deflection of the intermediate frequency signal is reduced so that the center frequency of the filters 5 need only be moved backwards and forwards a little in the high frequency range. Due to the filter transmission times and the delay associated therewith, in the case where an in phase action is brought about in the high frequency range between the oscillator voltage and the intermediate frequency voltage, there is an anti-phase action in the low frequency range which leads to a deflection increase. Such a deflection increase at low frequencies of the low frequency range is not prejudicial because the center frequency of the filters does not have to be followed-up so rapidly.

The phase rotation is performed in the feedback circuit between the output of the demodulator 6 and the oscillator 3 and, as can be gathered from the drawing, an inverter 8 is connected in said circuit. The inverter 8 inverts the low frequency signal, i.e. rotates its phase by 180°. Thus, using simple means and directly utilizing the transmission times, a deflection reduction is brought about in the higher low frequency range. A low-pass filter 9 is connected between the inverter 8 and the oscillator 3 for further transmission delay so that the transmission times of the complete circuit arrangement can be so adapted that the transition from anti-phase operation of the oscillator voltage with the intermediate frequency occurs in the desired frequency range. Furthermore, in order to somewhat reduce the deflection increase in the lower part of the low frequency range, a high-pass filter can be arranged in the feedback branch whose cutoff frequency (e.g. 300 Hz) is chosen in such a way that it does not influence the desired deflection reduction in the high frequency range.

The inverter 8 leads in a simple and inexpensive manner to a phase rotation of the low frequency signals in the feedback circuit and to a deflection reduction of the intermediate frequency signals in the higher frequency range. However, a phase rotation can also be brought about in other ways using phase shifters.

What is claimed is:

1. A method for converting frequency-modulated signals through at least one intermediate frequency into low frequency signals comprising the steps of:
    receiving frequency-modulated signals;
    mixing the received frequency-modulated signals with a frequency provided by an oscillator to generate intermediate frequency signals;
    filtering the intermediate frequency signals in a filter having a resonant frequency;
    demodulating the filtered intermediate frequency signals to generate low frequency signals;
    deriving a control voltage from the low frequency signals;
    controlling the resonant frequency of the filter by a filter control signal in accordance with the frequency shift of the intermediate frequency signals by means of the control voltage derived from the demodulated low frequency signals; and
    controlling the oscillator control voltage by phase rotating the low frequency signals by 180° to make the resonant frequency of the filter follow changes in the frequency of the intermediate frequency signals so as to decrease the deflection in the high frequency range of the low frequency signals.

2. A circuit for converting frequency-modulated signals through at least one intermediate frequency into low frequency signals comprising;
    an oscillator controlled by a control voltage;
    mixer means, controlled by the oscillator, for converting the received frequency-modulated signals into intermediate frequency signals;
    filter means having a resonant frequency and connected to the mixer means for filtering the intermediate frequency signals;
    demodulator means connected to the filter means for demodulating the intermediate frequency signals into low frequency signals;
    means, connected between the demodulator means and the filter means, for deriving a control voltage from the low frequency signals from the demodulator means to control the resonant frequency of the filter means in response to changes in the frequency of the intermediate frequency signals; and
    phase rotation means coupled between the demodulator means and the oscillator for phase rotating the low frequency signals and, thereby, the control voltage applied to the oscillator to make the resonant frequency of the filter means follow the changes in the frequency of the intermediate frequency signals so as to decrease the deflection in the high frequency range of the low frequency signals.
    low pass filter means connected between the phase rotating means and the oscillator.

3. The circuit of claim 2 wherein the phase rotating means comprises an inverter connected between the demodulator means and the oscillator.

4. The circuit of claim 2 further including:
    low pass filter means connected with the phase rotating means between the demodulator means and the oscillator.

5. The circuit of claim 2 further including:
    high pass filter means connected between the phase rotating means and the oscillator and having its cut-off frequencies selected so as not to influence the frequency signal reduction in the high frequency range of the low frequency signals.

* * * * *